(12) United States Patent
Waltrich

(10) Patent No.: US 11,713,131 B2
(45) Date of Patent: Aug. 1, 2023

(54) POWER CONVERTER COOLING IN AVIATION

(71) Applicant: Uwe Waltrich, Erlangen (DE)

(72) Inventor: Uwe Waltrich, Erlangen (DE)

(73) Assignee: Rolls-Royce Deutschland Ltd & Co KG, Blankenfelde-Mahlow (DE)

( * ) Notice: Subject to any disclaimer, the term of this patent is extended or adjusted under 35 U.S.C. 154(b) by 302 days.

(21) Appl. No.: 17/110,627

(22) Filed: Dec. 3, 2020

(65) Prior Publication Data

US 2021/0179285 A1    Jun. 17, 2021

(30) Foreign Application Priority Data

Dec. 13, 2019   (DE) .......................... 102019219573.3

(51) Int. Cl.
| | | |
|---|---|---|
| *B64D 33/08* | (2006.01) | |
| *B64D 27/24* | (2006.01) | |
| *H01L 23/367* | (2006.01) | |
| *F01P 7/08* | (2006.01) | |

(52) U.S. Cl.
CPC ............. *B64D 33/08* (2013.01); *B64D 27/24* (2013.01); *F01P 7/08* (2013.01); *H01L 23/3675* (2013.01)

(58) Field of Classification Search
CPC ...... B64D 27/24; B64D 33/08; H01L 23/3675
USPC .......................................................... 244/60
See application file for complete search history.

(56) References Cited

U.S. PATENT DOCUMENTS

| | | |
|---|---|---|
| 2009/0272854 A1 | 11/2009 | Violett |
| 2016/0137305 A1 | 5/2016 | Joubert |
| 2017/0225796 A1* | 8/2017 | Sun ........................ H01L 23/467 |
| 2020/0100399 A1* | 3/2020 | Pal .............................. F02C 7/32 |
| 2021/0179285 A1* | 6/2021 | Waitrich ............. H01L 23/3675 |

FOREIGN PATENT DOCUMENTS

| | | | |
|---|---|---|---|
| DE | 102018216859 A1 | 9/2019 | |
| EP | 3522341 A1 | 8/2019 | |
| EP | 3590827 A1 | 1/2020 | |
| GB | 2152147 A | 7/1985 | |

* cited by examiner

*Primary Examiner* — Brady W Frazier
(74) *Attorney, Agent, or Firm* — Lempia Summerfield Katz LLC

(57) ABSTRACT

An arrangement for cooling at least one power module of a power converter is disclosed herein. The arrangement includes power semiconductor components. The power module is arranged in a drive flow of an engine in such a way that the drive flow flows around cooling ribs of the power module. The disclosure also relates to a power converter, (e.g., an inverter), including an arrangement of this kind and an aircraft, (e.g., an airplane), including a power converter of this kind.

16 Claims, 4 Drawing Sheets

POWER CONVERTER COOLING IN AVIATION

The present patent document claims the benefit of German Patent Application No. 10 2019 219 573.3, filed Dec. 13, 2019, which is hereby incorporated by reference.

TECHNICAL FIELD

The disclosure relates to an arrangement for cooling a power module, which has power semiconductor components, of a power converter. The disclosure also relates to a power converter including an arrangement of this kind and to an aircraft, (e.g., an airplane), including a power converter having an arrangement of this kind.

BACKGROUND

The power modules for known power converters generate waste heat and generally have to be cooled. To this end, for example, power modules including flat assemblies are cooled using a planar air cooler.

Laid-open application DE 10 2018 216 859 A1 describes cooling of power semiconductors of a power module with the aid of specially designed and arranged cooling ribs. The power semiconductors are components of a power converter, in particular of an inverter.

SUMMARY

The object of the disclosure is to specify a solution by way of which cooling of power modules of power converters is provided in aviation applications. The scope of the present disclosure is defined solely by the appended claims and is not affected to any degree by the statements within this summary. The present embodiments may obviate one or more of the drawbacks or limitations in the related art.

Aerodynamically optimized or rounded surfaces around which the cooling air flows are present in aviation. If the air flow that is generated on account of a propeller or a turbine is intended to be used for cooling purposes, structural expenditure is necessary in order to connect the flat assembly to the free-form surfaces that are present.

In order to connect the flat power electronics assembly, modifications have to be made to existing structural components, or existing thin-walled structural components have to be reinforced. It is known to segment the flat assemblies and connect them to flattened cooling surfaces such that they are cooled on one side.

One aspect of the disclosure relates to the power modules. The thermally critical components of the power converter, specifically the power modules, are cooled on two sides via integrated air coolers and the drive flow that is present.

The end sides of the power modules are guided through the outer wall of the engine or nacelle via plug-in contacts in order to be electrically contact-connected to the other components (e.g., DC capacitor, driver printed circuit board, etc.) of the power converter there. This minimizes the contact surface to the bent connecting structure and is no longer relevant to cooling of the power modules.

The power modules are arranged along the flow direction and in the optimum case have a flow-optimized flat shape (for example, shark fin) with lateral cooling fins (e.g., cooling ribs).

The further components of the power converter (such as DC capacitor, motor connection, driver printed circuit board, etc.) are located on the opposite side of the outer wall (e.g., inside or outside depending on the construction of the drive, on the outside in the case of a turbofan such as turbine blades, on the inside in the case of propeller nacelles) in order to keep the power loss in the drive flow region to a minimum. The further components are cooled via the connection to the outer wall.

In turbofan engines, there is an intermediate space or cavity, through which there is no flow, between the outer wall and the nacelle wall.

The construction of the power module or of the integrated cooler is robust enough to prevent damage to the power module by accelerated particles, etc. Ceramic-embedded modules with an integrated double-sided ceramic cooler are advantageous.

As an alternative, the power module may have a casing (e.g., "protection case") which has corresponding openings for the cooling fins, provides additional protection, and generates the aerodynamic shape required. As a result, conventional known power modules which may be cooled on two sides may also be used.

In summary, the disclosure relates to an air-cooled power converter concept with power modules, which are cooled on two sides, for utilizing the engine flow as coolant flow for integration with and connection to existing rounded structural components, such as the engine nacelle.

The disclosure provides the following advantages.

In one advantage, a flexible design is provided for flat as well as round cooling surfaces, irrespective of the shape of the "cooling surface" because the cooling surface sits on both sides of the power module.

In another advantage, a possibility is provided for integration on existing structural components, for example onto the round outer skin of an engine nacelle.

In another advantage, a power converter concept with double-sided air cooling of power modules is provided.

In another advantage, a utilization of the engine flow as cooling flow is provided, so that no additional fan is required.

In another advantage, an ability is provided to easily replace the service life-related power converter components by plug-in AC, DC, and control connection.

In another advantage, an integrated cooling of the power supply line and power discharge line and of the intermediate circuit capacitor is provided.

The disclosure recites an arrangement for cooling at least one power module, which has a plurality of power semiconductor components, of a power converter, wherein the power module is arranged in the drive flow of an engine in such a way that the drive flow flows around cooling ribs of the power module.

The drive flow of an engine is also called engine emission or rotor emission. The cooling ribs are also called cooling fins.

In one refinement, the power module is of cylindrical or truncated cone-like design and the cooling ribs are oriented parallel to the drive flow.

Cylindrical may be understood to refer to a cylinder with any desired base or top surface. The same applies for the term truncated cone-like. For example, a straight cuboid is also a cylinder.

In a further refinement, the cooling ribs are formed on the left and on the right of the power module in the direction of the drive flow.

In one development, the arrangement has an engine nacelle on which the power module is arranged.

In aviation, the drive nacelle is also called "nacelle".

In one development, the arrangement has alternating current lines which connects an electric motor to the power module, wherein the alternating current lines are arranged on the engine nacelle in such a way that they may give off heat to the engine nacelle, that is to say they are operatively connected to the engine nacelle with respect to the transportation of heat.

The alternating current lines may also be called "busbars." The alternating current lines may be arranged on the other side of the jacket of the engine nacelle to the power module. As a result, the flow of the engine is not additionally impeded.

In a further refinement, the arrangement has an intermediate circuit capacitor of the power converter, which intermediate circuit capacitor is arranged on the engine nacelle in such a way that it may give off heat to the engine nacelle.

The intermediate circuit capacitor may be arranged on the other side of the jacket of the engine nacelle to the power module and as a result does not substantially impede the flow of the engine.

In a further embodiment, the power converter is an inverter. Inverter denotes a power converter which generates an AC voltage from a DC voltage, the frequency, and amplitude of the AC voltage being varied. An output AC voltage is generated from an input DC voltage by a DC voltage intermediate circuit and clocked semiconductor switches.

In a further refinement, the engine has a propeller or turbine blades.

In a further refinement, the outer shape of the power module is of streamlined, (e.g., shark fin-like), design. This may also be formed by an additional casing with openings through which the cooling ribs project.

The disclosure also claims an aircraft, (e.g., an airplane), including an arrangement for an electric or hybrid-electric drive.

Further special features and advantages of the disclosure will become clear from the following explanations of an exemplary embodiment with reference to schematic drawings.

DETAILED DESCRIPTION

Figure 1:
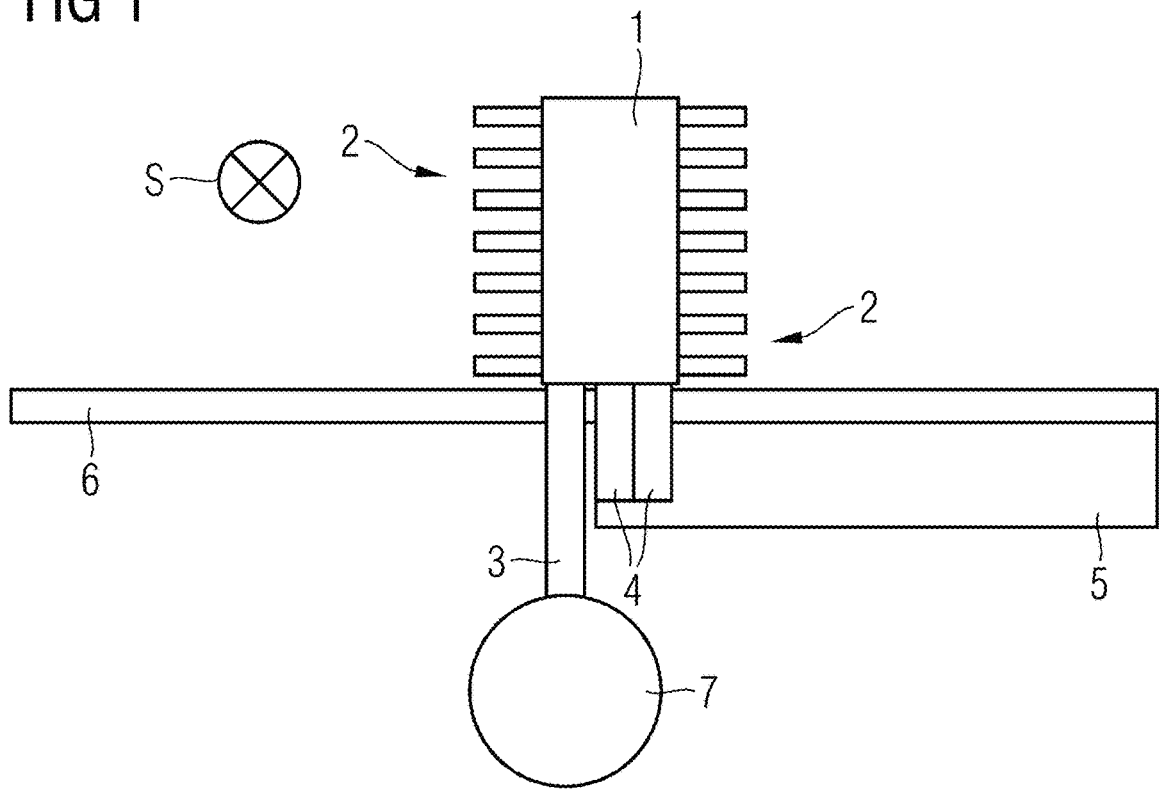
FIG. 1 depicts a sectional view of an example of an arrangement in the drive flow direction.

FIG. 1 depicts a schematic sectional view of an arrangement of power modules 1 (only one may be seen) of a power converter that are arranged on the outside of an engine nacelle 6 of an aircraft. The drive flow direction S of an electric engine including the electric motor 7 is perpendicular to the plane of the drawing.

The electric motor 7 is electrically connected to the power modules 1 via the alternating current lines 3. An intermediate circuit capacitor 5 which is arranged on the inner side of the engine nacelle 6 is electrically connected to the power modules 1 with the aid of the direct current lines 4. Owing to the arrangement of the power modules 1, the drive flow flows around the power modules and therefore draws heat from them.

Heat is drawn from the intermediate circuit capacitor 5, the alternating current lines 3, and the direct current lines 4 owing to their connection to the engine nacelle 6 and they do not impede the air flow.

The power module 1 has cooling ribs 2, which are formed parallel to the drive flow, on the left and on the right in the drive flow direction S. The power module 1 is of cylindrical design, e.g., of streamlined design, such as in the form of a shark fin. Other forms, such as truncated cones, are also possible. The only important factor is that the cooling ribs 2 lie as completely as possible in the drive flow.

Figure 2:
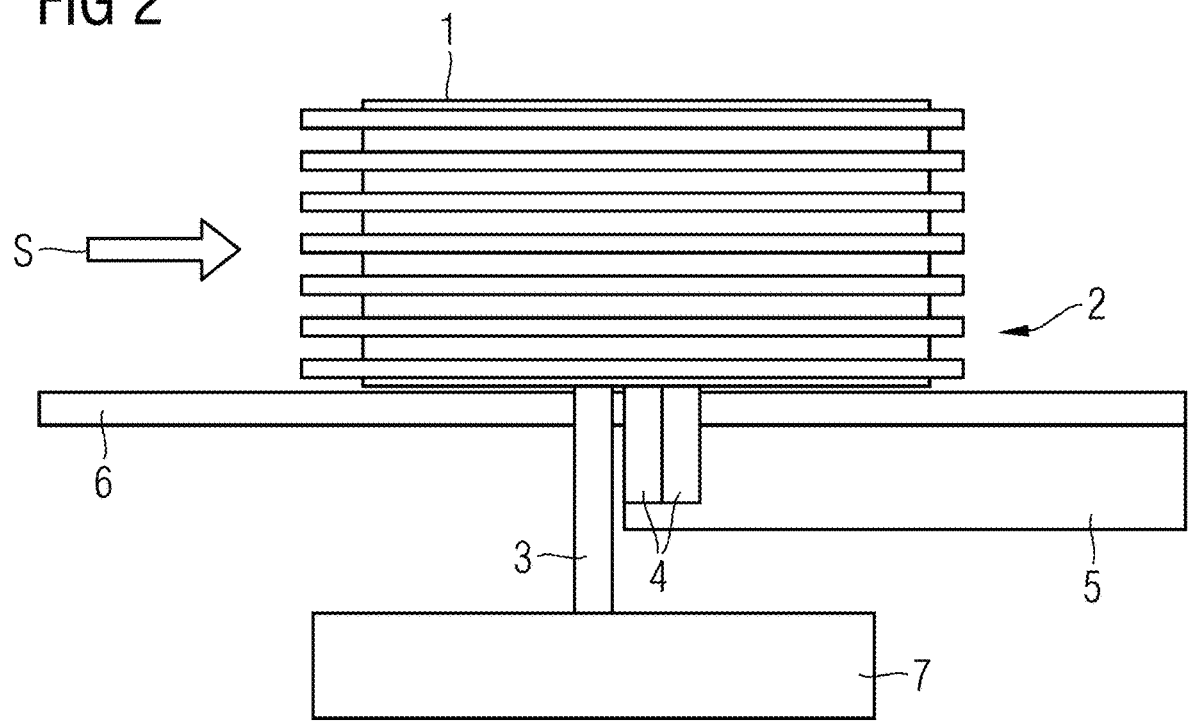
FIG. 2 depicts a sectional view of an example of an arrangement of power modules transversely to the drive flow direction.

FIG. 2 depicts a further sectional view of the arrangement according to FIG. 1, this time in a view perpendicular to the drive flow direction S. The power module 1 of a power converter is arranged on the outside of the engine nacelle 6 of an aircraft. The drive flow direction S of an electric engine including the electric motor 7 lies in the plane of the drawing.

The electric motor 7 is electrically connected to the power modules 1 via the alternating current lines 3. An intermediate circuit capacitor 5 arranged on the inner side of the engine nacelle 6 is electrically connected to the power modules 1 with the aid of the direct current lines 4. Owing to the arrangement of the power modules 1, the drive flow flows around the power modules and therefore draws heat from them.

Heat is drawn from the intermediate circuit capacitor 5, the direct current lines 4, and the alternating current lines 3 by the engine nacelle 6.

The power module 1 has cooling ribs 2, which are formed parallel to the drive flow, on the left (not visible) and on the right in the drive flow direction S. The power module 1 is of cylindrical design, e.g., of streamlined design, such as in the form of a shark fin. Other forms, such as truncated cones, are also possible. The only important factor is that the cooling ribs 2 lie as completely as possible in the drive flow.

Figure 3:
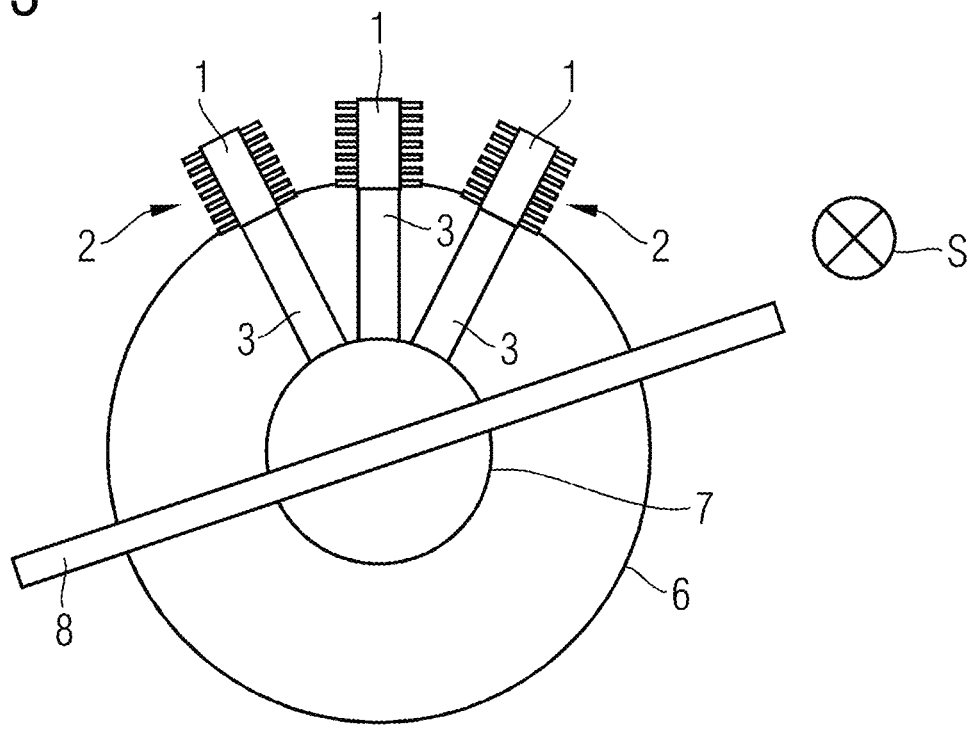
FIG. 3 depicts a sectional view of an example of an arrangement of power modules in the drive flow direction including a propeller.

FIG. 3 depicts a further sectional view of the arrangement according to FIG. 1 and FIG. 2 with three power modules 1 of a power converter which supply electrical energy to the electric motor 7 via the alternating current lines 3. The power modules 1 sit on the outside of the engine nacelle 6 and are cooled by the drive flow in direction S (perpendicularly into the plane of the drawing), which is generated by a propeller 8 driven by the electric motor 7.

Heat is likewise drawn from the alternating current lines 3 by the drive flow. For improved transportation of heat, the power modules 1 have cooling ribs 2 on the left and on the right with respect to the drive flow direction S.

Figure 4:
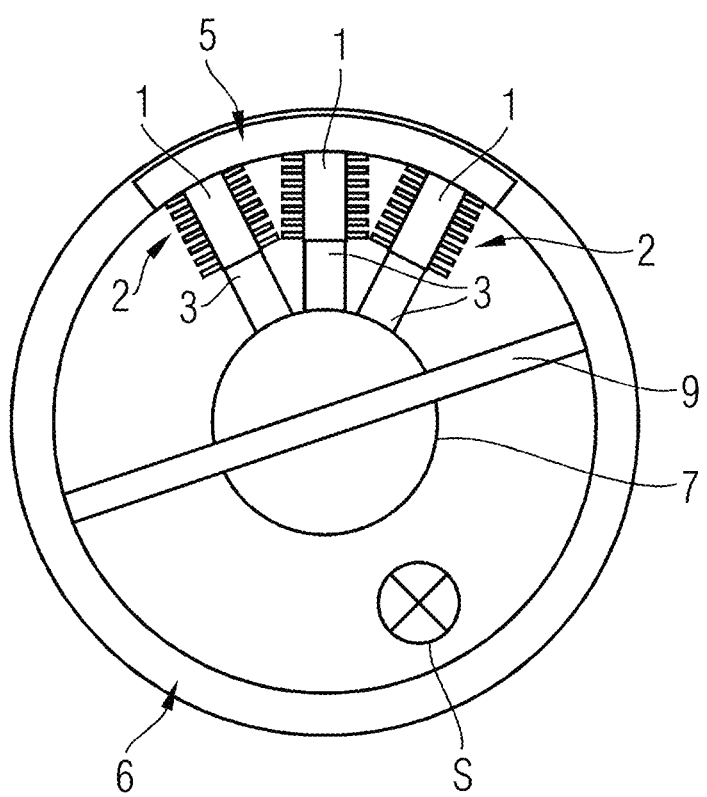
FIG. 4 depicts a sectional view of an example of an arrangement of power modules in the drive flow direction including a turbine blade.

FIG. 4 depicts a sectional view of a further arrangement similarly to FIG. 3, wherein however the engine nacelle is an engine nacelle 6 with a double jacket in the interior of which one or more turbine blades 9 rotate, the turbine blades generating a drive flow in direction S, that is to say perpendicularly into the plane of the drawing.

The three power modules 1 are arranged within the engine nacelle 6, and the intermediate circuit capacitor 5 is arranged between the two jackets, so that heat is likewise drawn from these components, just like the alternating current lines 3, by the drive flow. The turbine blade 9 is driven by the electric motor 7. The power modules 1 have cooling ribs 2 for improved drawing of heat.

Figure 5:
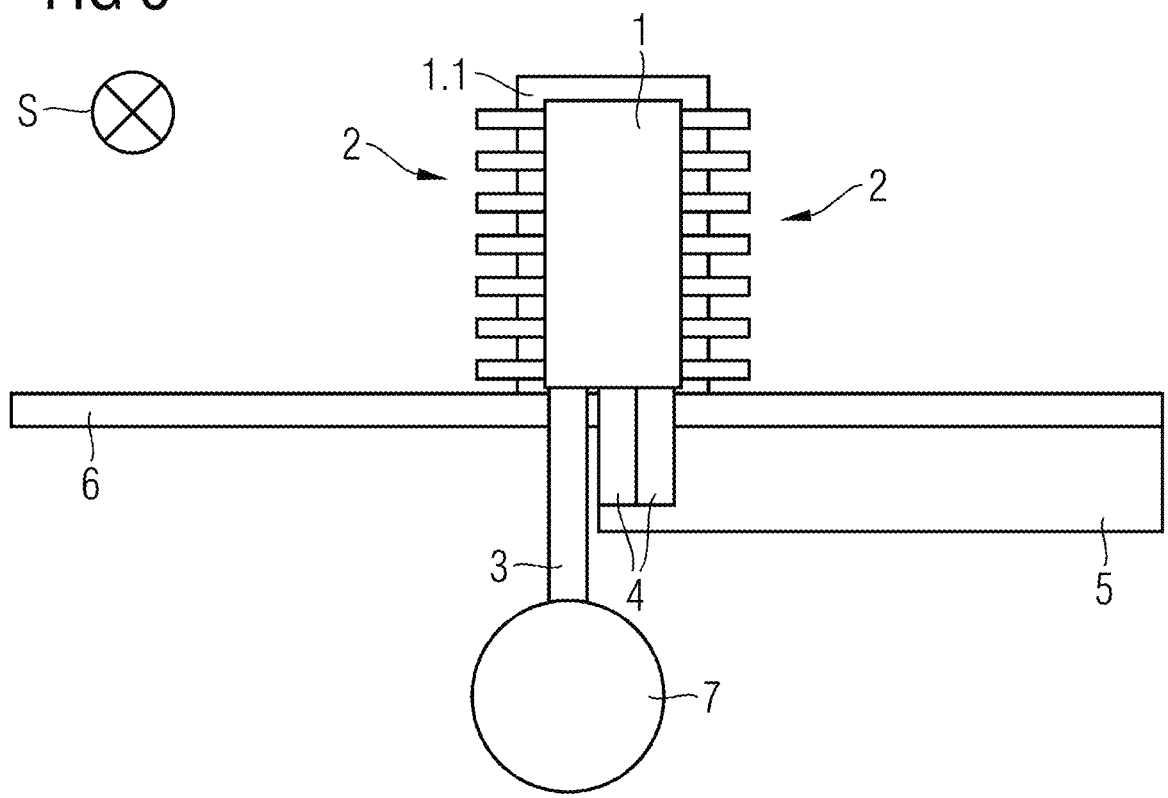
FIG. 5 depicts a sectional view of an example of an arrangement of power modules in the drive flow direction including a casing for the power module.

FIG. 5 depicts an alternative arrangement of power modules 1 on an engine nacelle 6 to FIG. 1 and FIG. 2. In this arrangement, the power module 1 has an additional casing 1.1 as protection for the electrical components of the power module 1. In this case, the cooling ribs 1 are formed on the casing 1.1 of the power module 1. The rest of the arrangement corresponds to that in FIG. 1.

For reasons of simplification, the driver/control printed circuit boards are not illustrated in the above figures. The driver output stage may also be integrated into the power module 1 and likewise cooled by the drive flow. As an alternative, the driver/control constituent part of the power converter may be connected to one side of the wall of the engine nacelle 6 via printed circuit boards.

Figure 6:
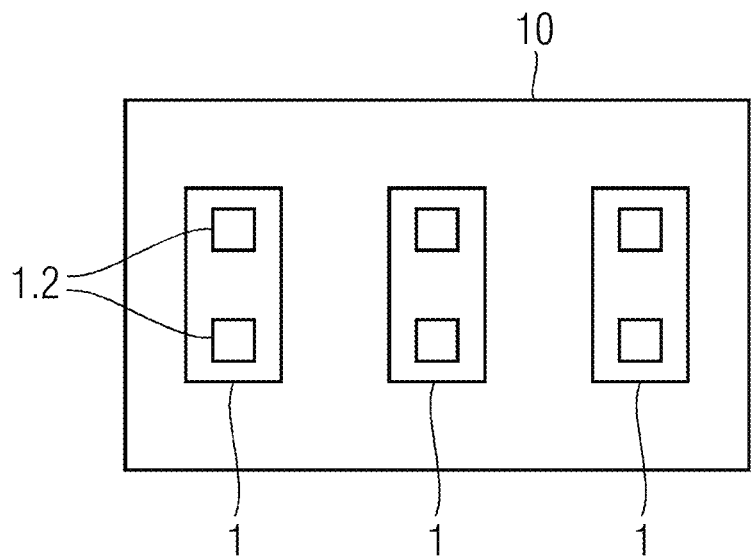
FIG. 6 depicts a block diagram of an example of an inverter including an arrangement of power modules.

FIG. 6 depicts a block diagram of an inverter 10 which has three power modules 1 which are arranged in a drive flow in accordance with the above figures. The inverter 10 serves to supply electrical energy to an electric motor, not illustrated, and contains additional components of an inverter, such as an intermediate circuit capacitor and a driver circuit, for example. The power modules 1 have power semiconductor components 1.2 which are substantially responsible for the development of heat by the power modules 1.

Figure 7:
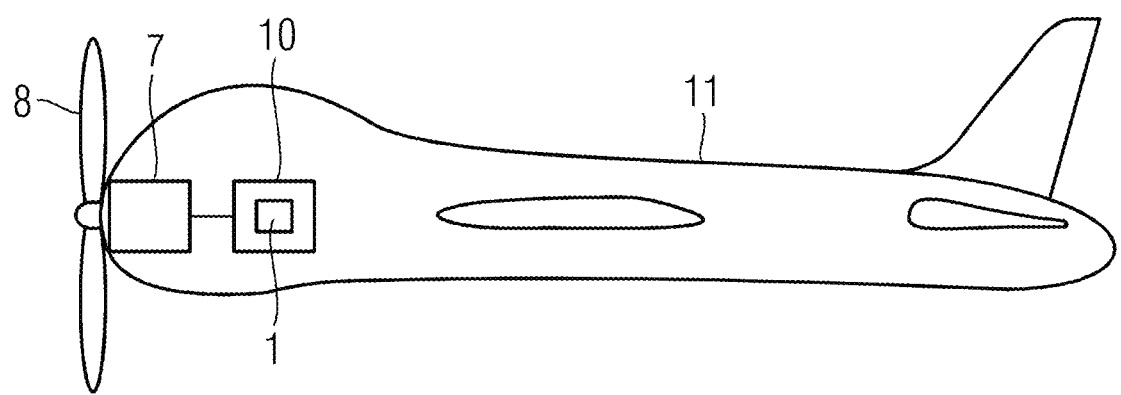
FIG. 7 depicts a view of an example of an airplane including an inverter.

FIG. 7 depicts an airplane 11 as an example of an aircraft including an electric or hybrid-electric drive. An inverter 10 according to FIG. 6 supplies an electric motor 7 with electrical energy. The electric motor 7 drives a propeller 8 which generates the drive flow for cooling the components of the inverter 10 in accordance with FIG. 3.

Although the disclosure has been described and illustrated more specifically in detail by the exemplary embodiments, the disclosure is not restricted by the disclosed examples and other variations may be derived therefrom by a person skilled in the art without departing from the scope of protection of the disclosure.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

LIST OF REFERENCE SIGNS

1 Power module
1.1 Casing
1.2 Power semiconductor component
2 Cooling rib
3 Alternating current line
4 Direct current line
5 Intermediate circuit capacitor
6 Engine nacelle
7 Electric motor
8 Propeller
9 Turbine blade
10 Inverter
11 Airplane
S Drive flow direction

The invention claimed is:

1. An arrangement for cooling a power module of a power converter, the arrangement comprising:
    the power module comprising power semiconductor components and cooling ribs;
    an engine nacelle arranged on an outer side of the power module; and
    alternating current lines that connect an electric motor to the power module, wherein the alternating current lines are operatively connected to the engine nacelle such that the alternating current lines are configured to give off heat to the engine nacelle,
    wherein the power module is arranged in a drive flow of an engine such that the drive flow flows around the cooling ribs of the power module.

2. The arrangement of claim 1, wherein the power module comprises a cylindrical design or truncated cone design, and wherein the cooling ribs are oriented parallel to the drive flow.

3. The arrangement of claim 2, wherein the cooling ribs are positioned on a left side of the power module and on a right side of the power module in a direction of the drive flow.

4. The arrangement of claim 1, further comprising:
    an intermediate circuit capacitor of the power converter,
    wherein the intermediate circuit capacitor is arranged on the engine nacelle such that the intermediate circuit capacitor is configured to give off heat to the engine nacelle.

5. The arrangement of claim 1, wherein the cooling ribs are positioned on a left side of the power module and on a right side of the power module in a direction of the drive flow.

6. The arrangement of claim 1, wherein the alternating current lines are arranged on the engine nacelle.

7. The arrangement of claim 6, further comprising:
    an intermediate circuit capacitor of the power converter,
    wherein the intermediate circuit capacitor is arranged on the engine nacelle such that the intermediate circuit capacitor is configured to give off heat to the engine nacelle.

8. The arrangement of claim 1, further comprising:
    a casing of the power module, wherein the casing has openings through which the cooling ribs project.

9. The arrangement of claim 1, wherein the power converter is an inverter.

10. The arrangement of claim 1, further comprising:
    a propeller or turbine blades configured to generate the drive flow.

11. The arrangement of claim 1, wherein an outer shape of the power module has a streamlined design.

12. The arrangement of claim 11, wherein the streamlined design is a shark fin design.

13. An aircraft comprising:
    an electric or hybrid-electric drive; and
    an arrangement having:
        a power module of a power converter, wherein the power module comprises power semiconductor components and cooling ribs;
        an engine nacelle arranged on an outer side of the power module; and
        alternating current lines that connect an electric motor to the power module, wherein the alternating current lines are operatively connected to the engine nacelle such that the alternating current lines are configured to give off heat to the engine nacelle, wherein the power module is arranged in a drive flow of an engine of the electric or the hybrid-electric drive such that the drive flow flows around the cooling ribs of the power module.

14. The aircraft of claim 13, further comprising:

a propeller or turbine blades configured to generate the drive flow.

15. The aircraft of claim 13, wherein the aircraft is an airplane.

16. The aircraft of claim 13, wherein the alternating current lines are arranged on the engine nacelle.

* * * * *